United States Patent
Yao et al.

(10) Patent No.: US 9,741,304 B2
(45) Date of Patent: Aug. 22, 2017

(54) SHIFT REGISTER UNIT AND DRIVING METHOD THEREOF, SHIFT REGISTER CIRCUIT, AND DISPLAY APPARATUS

(71) Applicants: BOE Technology Group Co., Ltd., Beijing (CN); Beijing BOE Display Technology Co., Ltd., Beijing (CN)

(72) Inventors: Shulin Yao, Beijing (CN); Seung Min Lee, Beijing (CN); Zhihua Sun, Beijing (CN); Xingji Wu, Beijing (CN); Wenhai Cui, Beijing (CN); Baoyu Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 157 days.

(21) Appl. No.: 14/785,689

(22) PCT Filed: Mar. 27, 2015

(86) PCT No.: PCT/CN2015/075253
§ 371 (c)(1),
(2) Date: Oct. 20, 2015

(87) PCT Pub. No.: WO2016/065834
PCT Pub. Date: May 6, 2016

(65) Prior Publication Data
US 2016/0260398 A1  Sep. 8, 2016

(30) Foreign Application Priority Data

Oct. 29, 2014  (CN) .......................... 2014 1 0594545

(51) Int. Cl.
*G09G 3/36* (2006.01)
*G09G 3/3258* (2016.01)
(Continued)

(52) U.S. Cl.
CPC ......... *G09G 3/3648* (2013.01); *G09G 3/3258* (2013.01); *G09G 3/3266* (2013.01);
(Continued)

(58) Field of Classification Search
CPC ......... G09G 2300/0408; G09G 3/3677; G09G 2310/0286; G09G 2310/0289;
(Continued)

(56) References Cited

U.S. PATENT DOCUMENTS 8,194,817 B2 *  6/2012  Tobita .................. G09G 3/3677
377/64
2011/0122988 A1 *  5/2011  Miyayama ............. G11C 19/28
377/64
(Continued)

FOREIGN PATENT DOCUMENTS

CN  102654986 A  9/2012
CN  102831860 A  12/2012
(Continued)

OTHER PUBLICATIONS

International Search Report and Written Opinion for PCT Application No. PCT/CN2015/075253, dated Jul. 30, 2015, 8 pages.
(Continued)

*Primary Examiner* — Duc Dinh
(74) *Attorney, Agent, or Firm* — Westman, Champlin & Koehler, P.A.

(57) ABSTRACT

The application relates to a shift register unit and a driving method thereof, a shift register circuit and a display apparatus. The shift register unit may include a gate starting terminal, a first clock terminal, a second clock terminal, a reset terminal, a low level terminal, a gate output terminal, a storage capacitor, a charging module, an output control module and a reset module. In the shift register according to the present application, since the reset operation is under
(Continued)

control of the second transistor and the fifth transistor both, an improper reset operation will not occur, even if the signal at the reset terminal is unstable.

13 Claims, 2 Drawing Sheets

(51) Int. Cl.
    *G09G 3/3266*    (2016.01)
    *G11C 19/28*    (2006.01)
    *H03K 19/003*    (2006.01)

(52) U.S. Cl.
    CPC ........... *G09G 3/3677* (2013.01); *G11C 19/28* (2013.01); *G09G 2300/04* (2013.01); *G09G 2310/0267* (2013.01); *G09G 2310/0286* (2013.01); *G09G 2310/061* (2013.01); *G09G 2310/08* (2013.01); *H03K 19/00361* (2013.01)

(58) Field of Classification Search
    CPC ......... G09G 2320/0233; G09G 3/3266; G09G 2300/0861; G09G 2300/0842; G09G 2310/0218; G09G 2310/027; G09G 3/3283; G09G 2300/043; G11C 19/28; G11C 19/184; G11C 13/025; G11C 11/404; G11C 11/405; G11C 13/004; G11C 15/046; G11C 16/02; G11C 19/00; G11C 2207/2236; G11C 2213/16; G11C 2213/79; G11C 23/00

USPC ............................................ 345/98, 99, 100
See application file for complete search history.

(56) References Cited

U.S. PATENT DOCUMENTS

2011/0216877 A1    9/2011  Hsu et al.
2011/0274234 A1*  11/2011  Sakamoto ............ G11C 19/184
                                                                                  377/64
2014/0119493 A1    5/2014  Yang et al.
2014/0168049 A1    6/2014  Gu et al.

FOREIGN PATENT DOCUMENTS

CN        102867543 A    1/2013
CN        103646636 A    3/2014
JP         2010-49767 A    3/2010

OTHER PUBLICATIONS

English translation of Box No. V from the Written Opinion for the International Searching Authority for PCT Application No. PCT/CN2015/075253, 2 pages.

First Office Action, including Search Report, for Chinese Patent Application No. 201410594545.X, dated Feb. 3, 2016, 6 pages.

\* cited by examiner

SHIFT REGISTER UNIT AND DRIVING METHOD THEREOF, SHIFT REGISTER CIRCUIT, AND DISPLAY APPARATUS

CROSS-REFERENCE TO RELATED APPLICATIONS

This application is a Section 371 National Stage Application of International Application No. PCT/CN2015/075253, filed 27 Mar. 2015, entitled "SHIFT REGISTER UNIT AND DRIVING METHOD THEREOF, SHIFT REGISTER CIRCUIT, AND DISPLAY APPARATUS", which has not yet published, which claims priority to Chinese Application No. 201410594545.X, filed on 29 Oct. 2014, incorporated herein by reference in their entirety.

TECHNICAL FIELD

The application relates to the field of display technology, and particularly relates to a shift register unit and a driving method thereof, a shift register circuit and a display apparatus.

BACKGROUND

In the Gate Drive on Array (GOA) technology, functions of a gate driving circuit IC are formed on an array substrate to improve the compactness of a liquid crystal display panel and reduce the costs for materials and manufacturing processes. As show in FIG. 1, a GOA circuit includes a plurality of GOA units, each of which corresponds to a gate driving output, thereby achieving the functions of the gate driving circuit IC.

However, there is one problem for the GOA unit, that is, the reset signal itself may be unstable, leading to faulty conduction of the transistor connected with the reset signal in the GOA unit, and hence improper reset operation.

SUMMARY OF THE INVENTION

Technical Problem

The present disclosure is to avoid misoperations at the reset terminal of the GOA unit.

Solution to the Problem

In order to solve the problem, the present disclosure provides a shift register unit, including:
  a gate starting terminal;
  a first clock terminal;
  a storage capacitor;
  a charging module, connected with the gate starting terminal, the first clock terminal and the storage capacitor, and adapted to charge the storage capacitor to a high level under control of the gate starting terminal and the first clock terminal;
  a second clock terminal;
  a gate output terminal;
  an output control module, connected with the second clock terminal, the storage capacitor and the gate output terminal, and adapted to output a level signal of the second clock terminal to the gate output terminal when the storage capacitor is at a high level;
  a reset terminal;
  a low level terminal; and
  a reset module, including a second transistor, a fourth transistor and a fifth transistor, wherein a gate of the second transistor is connected to the reset terminal, a source thereof is connected to a first terminal of the storage capacitor, and a drain thereof is connected to a gate of the fifth transistor; a gate of the fourth transistor is connected to the reset terminal, a source thereof is connected to the gate output terminal, and a drain thereof is connected to the low level terminal; a source of the fifth transistor is connected to the first terminal of the storage capacitor, and a drain thereof is connected to the low level terminal; the second transistor and the fifth transistor are used to connect the first terminal of the storage capacitor with the low level terminal under control of the reset terminal, the fourth transistor is used to connect the gate output terminal with the low level terminal under control of the reset terminal.

Preferably, a gate turning-on voltage of the fifth transistor is greater than that of the second transistor.

Preferably, the charging module includes a first transistor and a sixth transistor, wherein a gate and a source of the first transistor are connected to the gate starting terminal, and a drain thereof is connected to the first terminal of the storage capacitor to charge the storage capacitor when the gate starting terminal is at a high level; a gate of the sixth transistor is connected to the first clock terminal, a source thereof is connected to the gate starting terminal, and a drain thereof is connected to the first terminal of the storage capacitor to charge the storage capacitor when the gate starting terminal and the first clock terminal are both at a high level.

Preferably, the output control module includes a third transistor, wherein a gate of the third transistor is connected to the first terminal of the storage capacitor, a source thereof is connected to the second clock terminal, and a drain thereof is connected to the gate output terminal which is connected to the second terminal of the storage capacitor; the third transistor is used to output a level signal of the second clock terminal to the gate output terminal when the first terminal of the storage capacitor is at a high level.

The present disclosure further provides a driving method for the above shift register unit, including:
  applying a high level to the gate starting terminal and the first clock terminal and a low level to the second clock terminal, such that the charging module charges the storage capacitor to a high level under control of the gate starting terminal and the first clock terminal, and the gate output terminal outputs the low level of the second clock terminal;
  applying a low level to the gate starting terminal and the first clock terminal and a high level to the second clock terminal, such that the output control module controls the gate output terminal to output the high level of the second clock terminal while maintaining the storage capacitor at a high level; and
  applying a high level to the reset terminal such that the second transistor is turned on, and delivering the high level of the first terminal of the storage capacitor to the gate of the fifth transistor at the same time such that the fifth transistor is turned on, and the first terminal of the storage capacitor is pulled to a low level; and the fourth transistor is turned on at the same time to make the gate output terminal output a low level.

Preferably, the step of applying a high level to the gate starting terminal and the first clock terminal and a low level to the second clock terminal, such that the charging module charges the storage capacitor to a high level under control of the gate starting terminal and the first clock terminal, and the gate output terminal outputs the low level of the second clock terminal particularly includes:

applying a high level to the gate starting terminal and the first clock terminal, such that the first transistor and the sixth transistor are turned on, the first terminal of the storage capacitor is charged to a high level, and the third transistor is turned on;

applying a low level to the second clock terminal at the same time, such that the low level of the second clock terminal is outputted to the gate output terminal.

Preferably, the applying a low level to the gate starting terminal and the first clock terminal and a high level to the second clock terminal, such that the output control module controls the gate output terminal to output the high level of the second clock terminal while maintaining the storage capacitor at a high level particularly include:

applying a low level to the gate starting terminal and the first clock terminal, such that the first transistor and the sixth transistor are turned off, the first terminal of the storage capacitor is maintained at a high level, and the third transistor is turned on;

applying a high level to the second clock terminal at the same time, such that the high level of the second clock terminal is outputted to the gate output terminal through the third transistor.

The present disclosure further provides a shift register circuit, including a plurality of cascaded shift register units as above. A signal at the gate output terminal of the shift register unit in the next stage is fed back to the reset terminal of the shift register unit in the precedent stage.

The present disclosure further provides a display apparatus, including the shift register circuit as above.

Advantageous Effects of the Invention

In the shift register unit according the present disclosure, since the reset operation is under control of the second transistor and the fifth transistor both, there will not be any faulty reset operation, even if the signal at the reset terminal is unstable.

BRIEF DESCRIPTION OF THE DRAWING FIGURES

DETAILED DESCRIPTION OF THE EXEMPLARY EMBODIMENTS

In the following, the specific implementations of the present disclosure are discussed in detail in combination of the figures and various embodiments. The following embodiments are intended to illustrate the present disclosure, rather than limit the scope of the disclosure.

Figure 1:
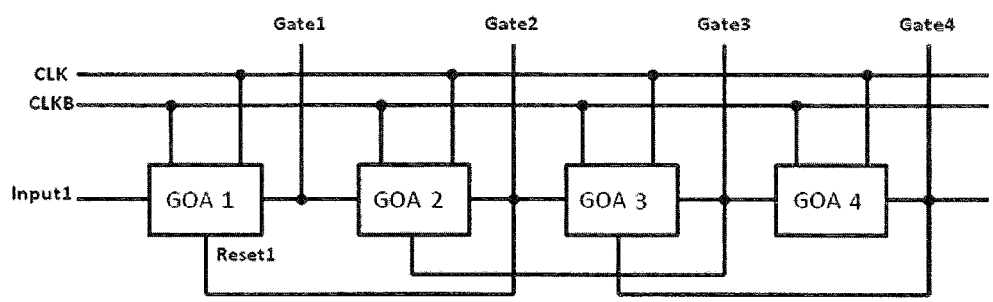
FIG. 1 is a structural diagram of a shift register circuit.
Figure 2:
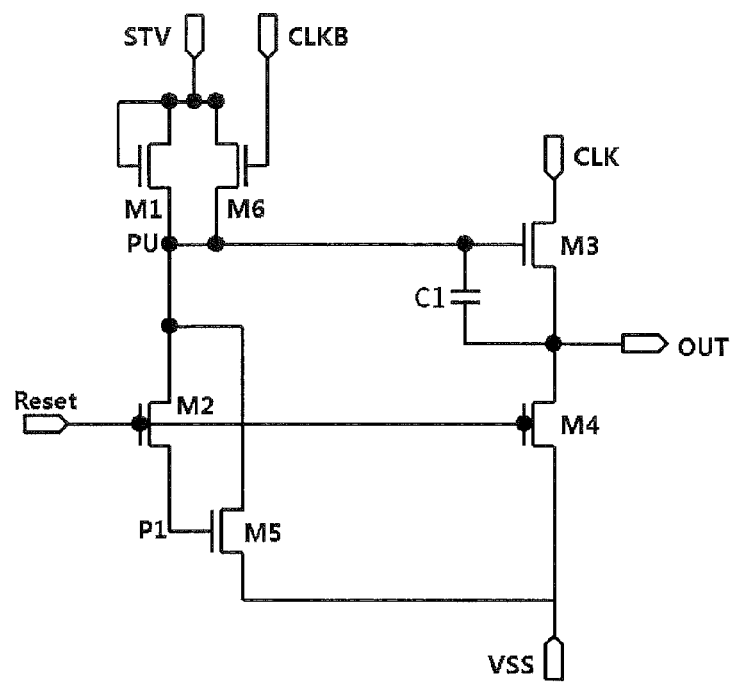
FIG. 2 is a structural diagram of the shift register circuit according to an embodiment of the present disclosure.

As shown in FIG. 2, the present disclosure provides a shift register unit, which includes: a gate starting terminal (STV), a first clock terminal (CLKB), a second clock terminal (CLK), a reset terminal (Reset), a low level terminal (VSS), a gate output terminal (OUT), a storage capacitor (C1), a charging module, an output control module and a reset module.

The charging module is connected with the gate starting terminal (STV), the first clock terminal (CLKB) and the storage capacitor (C1), and adapted to charge the storage capacitor (C1) to a high level under the control of the gate starting terminal (SW) and the first clock terminal (CLKB), i.e. the node PU in FIG. 2 is at a high level.

The output control module is connected with the second clock terminal (CLK), the storage capacitor (C1) and the gate output terminal (OUT), and adapted to output the level signal of the second clock terminal (CLK) to the gate output terminal (OUT) when the storage capacitor (C1) is at a high level.

The reset module is connected with the reset terminal (Reset), the low level terminal (VSS), the storage capacitor (C1) and the gate output terminal (OUT), and adapted to connect both terminals of the storage capacitor (C1) and the gate output terminal (OUT) to the low level terminal (VSS) under the control of the reset terminal (Reset). Particularly, the reset module may include a second transistor (M2), a fourth transistor (M4) and a fifth transistor (M5). The gate of the second transistor (M2) is connected to the reset terminal (Reset), the source thereof is connected to a first terminal of the storage capacitor (C1), and the drain thereof is connected to the gate of the fifth transistor (M5). The gate of the fourth transistor (M4) is connected to the reset terminal (Reset), the source thereof is connected to the gate output terminal (OUT), and the drain thereof is connected to the low level terminal (VSS). The source of the fifth transistor (M5) is connected to the first terminal of the storage capacitor (C1), and the drain thereof is connected to the low level terminal (VSS). The second transistor (M2) and the fifth transistor (M5) are used to connect the first terminal of the storage capacitor (C1) with the low level terminal (VSS) under the control of the reset terminal (Reset). The fourth transistor (M4) is used to connect the gate output terminal (OUT) with the low level terminal (VSS) under the control of the reset terminal (Reset).

When the Reset signal fluctuates due to instability, the second transistor (M2) is slightly turned on, and the voltage at the node P1 is not sufficient for turning on the fifth transistor (M5). At this time, the first terminal of the storage capacitor (C1), i.e. the voltage at the node PU, cannot be pulled to the low level terminal (VSS). Thus, in the shift register unit according to the present disclosure, the improper reset operation due to the instability of the Reset signal will not happen.

In the present embodiment, the charging module may include a first transistor (M1) and a sixth transistor (M6), wherein the gate and source of the first transistor (M1) are connected to the gate starting terminal (STV), and the drain thereof is connected to the first terminal of the storage capacitor (C1) to charge the storage capacitor (C1) when the gate starting terminal (STV) is at a high level. The gate of the sixth transistor (M6) is connected to the first clock terminal (CLKB), the source thereof is connected to the gate starting terminal (STV), and the drain thereof is connected to the first terminal of the storage capacitor (C1) to charge the storage capacitor (C1) when the gate starting terminal (STV) and the first clock terminal (CLKB) are at high levels.

The output control module may include a third transistor (M3). The gate of the third transistor (M3) is connected to the first terminal of the storage capacitor (C1), the source thereof is connected to the second clock terminal (CLK), and the drain thereof is connected to the gate output terminal (OUT) which is connected to the second terminal of the storage capacitor (C1). The third transistor (M3) is used to output the level signal of the second clock terminal (CLK)

to the gate output terminal (OUT) when the first terminal of the storage capacitor (C1) is at a high level.

Further, the gate turning-on voltage of the fifth transistor (M5) may be greater than that of the second transistor (M2). Therefore, it is ensured that the voltage at the node P1 will not turn on the fifth transistor (M5) when the second transistor (M2) is slightly turned on.

Figure 3:
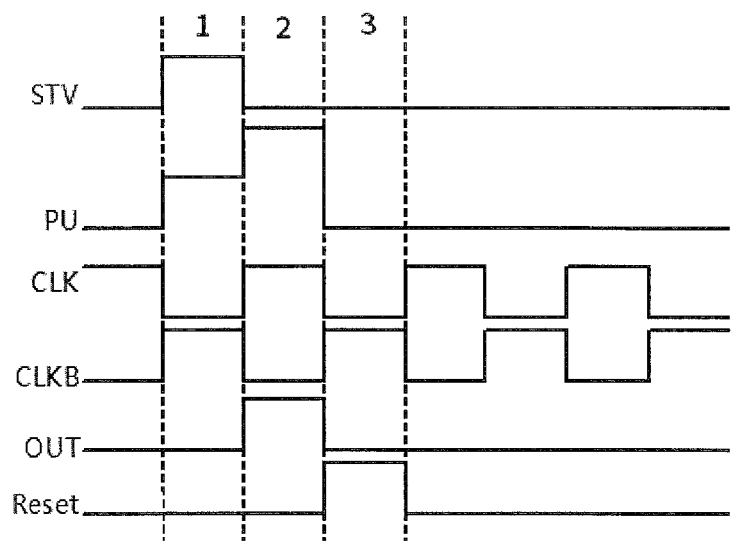
FIG. 3 is an operation timing diagram of the shift register unit in FIG. 2.

The operation timing diagram of the shift register unit according to the present disclosure is shown in FIG. 3, particularly:

In phase 1, the STV and the CLKB are both at high levels, and the CLK is at a low level. At this point, the transistors of M1 and M6 are turned on, the voltage at the node PU is pulled to a high level so as to charge the storage capacitor (C1). The transistor M3 is turned on, and the OUT outputs the low level of the CLK terminal.

In phase 2, the STV and the CLKB are both at low levels, and the CLK is at a high level. The voltage at the node PU is maintained at a high level by the storage capacitor (C1). The transistor M3 is turned on, and the OUT outputs the high level of the CLK terminal.

In phase 3, when the high level at the OUT of the shift register unit in the next stage is fed back to the shift register unit in the present stage, i.e. the Reset is at a high level, the transistor M2 is turned on, the voltage at the node P1 is pulled to a high level, the transistor M5 is turned on at the same time, and the voltage at the node PU is pulled to the low level of the VSS, thereby achieving the Reset on the present shift register unit. At the same time, the transistor M4 is turned on, the voltage at the OUT is pulled to the low level of the VSS, and the output of the shift register unit is turned off, i.e. the OUT stop outputting the high level.

In the present embodiment, when the Reset signal fluctuates due to its instability, the second transistor (M2) is slightly turned on, and the voltage at the node P1 is not sufficient for turning on the fifth transistor (M5). At this time, the voltage at the node PU cannot be pulled to the VSS. Thus, in the shift register unit according to the present disclosure, the improper reset operation due to the instability of the Reset signal will not happen. The reset operation may be properly performed by the shift register unit only if both of the transistors M2 and M5 are turned on.

The present disclosure also provides a driving method for the shift register unit mentioned above, which may include three phases as follows:

In phase 1, applying a high level to the gate starting terminal (STV) and the first clock terminal (CLKB) and a low level to the second clock terminal (CLK), such that the charging module may charge the storage capacitor (C1) to a high level under the control of the gate starting terminal (STV) and the first clock terminal (CLKB), and the gate output terminal (OUT) may output the low level of the second clock terminal (CLK). Particularly, a high level is applied to the gate starting terminal (STV) and the first clock terminal (CLKB), the first transistor (M1) and the sixth transistor (M6) are turned on, the first terminal of the storage capacitor (C1) is charged to a high level, and the third transistor (M3) is turned on. At the same time, a low level is applied to the second clock terminal (CLK), such that the low level at the second clock terminal (CLK) is outputted to the gate output terminal (OUT).

In phase 2, applying a low level to the gate starting terminal (STV) and the first clock terminal (CLKB) and a high level to the second clock terminal (CLK), such that the output control module may control the gate output terminal (OUT) to output the high level of the second clock terminal (CLK) while maintaining the storage capacitor (C1) at a high level. Particularly, a low level is applied to the gate starting terminal (STV) and the first clock terminal (CLKB), the first transistor (M1) and the sixth transistor (M6) are turned off, the first terminal of the storage capacitor (C1) is maintained at the high level, such that the third transistor (M3) is turned on. At the same time, a high level is applied to the second clock terminal (CLK), and the high level of the second clock terminal (CLK) is outputted to the gate output terminal (OUT) by the third transistor (M3).

In phase 3, a high level is applied to the reset terminal (Reset), the second transistor (M2) is turned on, and the high level of the first terminal of the storage capacitor (C1) is delivered to the gate of the fifth transistor (M5) such that the fifth transistor (M5) is turned on, and the first terminal of the storage capacitor (C1) is pulled to a low level. At the same time, the fourth transistor (M4) is turned on, such that the gate output terminal (OUT) outputs a low level.

The present disclosure also provides a shift register circuit, including a plurality of cascaded shift register units mentioned above, in which the signal at the gate output terminal of the shift register unit in the next stage is fed back to the reset terminal of the shift register unit in the precedent stage.

The present disclosure also provides a display apparatus, including the shift register unit mentioned above. The display apparatus may be any product or component that has a display function, such as a liquid crystal panel, an electronic paper, an OLED panel, a cell phone, a tablet, a television, a display, a laptop computer, a digital photo frame, a navigator and the like.

The above implementations are merely used to illustrate the present disclosure, and are not intended to limit the scope of the disclosure. Those skilled in the art can make various variations and changes therein without departing the scope and spirit of the present disclosure. Therefore, all of the equivalent solutions should be also included in the scope of the present disclosure, which is merely defined by the appended claims.

The invention claimed is:

1. A shift register unit, including:
   a gate starting terminal;
   a first clock terminal ;
   a storage capacitor;
   a charging module, connected with the gate starting terminal, the first clock terminal and the storage capacitor, and adapted to charge the storage capacitor to a high level under control of the gate starting terminal and the first clock terminal;
   a second clock terminal;
   a gate output terminal;
   an output control module, connected with the second clock terminal, the storage capacitor and the gate output terminal, and adapted to output a level signal of the second clock terminal to the gate output terminal when the storage capacitor is at a high level;
   a reset terminal;
   a low level terminal; and
   a reset module, including a second transistor, a fourth transistor and a fifth transistor, wherein a gate of the second transistor is connected to the reset terminal, a source thereof is connected to a first terminal of the storage capacitor, and a drain thereof is connected to a gate of the fifth transistor; a gate of the fourth transistor is connected to the reset terminal, a source thereof is connected to the gate output terminal, and a drain thereof is connected to the low level terminal; a source of the fifth transistor is connected to the first terminal of the storage capacitor, and a drain thereof is connected to the low level terminal; the second transistor and the fifth transistor are used to connect the first terminal of the storage capacitor with the low level terminal under control of the reset terminal, the fourth transistor is used to connect the gate output terminal with the low level terminal under control of the reset terminal.

2. The shift register unit of claim 1, wherein a gate turning-on voltage of the fifth transistor is greater than that of the second transistor.

3. The shift register unit of claim 1, wherein the charging module includes a first transistor and a sixth transistor, wherein a gate and a source of the first transistor are connected to the gate starting terminal, and a drain thereof is connected to the first terminal of the storage capacitor to charge the storage capacitor when the gate starting terminal is at a high level; a gate of the sixth transistor is connected to the first clock terminal, a source thereof is connected to the gate starting terminal, and a drain thereof is connected to the first terminal of the storage capacitor to charge the storage capacitor when the gate starting terminal and the first clock terminal are both at a high level.

4. The shift register unit of claim 3, wherein the output control module includes a third transistor, wherein a gate of the third transistor is connected to the first terminal of the storage capacitor, a source thereof is connected to the second clock terminal, and a drain thereof is connected to the gate output terminal which is connected to the second terminal of the storage capacitor; the third transistor is used to output a level signal of the second clock terminal to the gate output terminal when the first terminal of the storage capacitor is at a high level.

5. A driving method for the shift register unit of claim 4, including:
applying a high level to the gate starting terminal and the first clock terminal and a low level to the second clock terminal, such that the charging module charges the storage capacitor to a high level under control of the gate starting terminal and the first clock terminal, and the gate output terminal outputs the low level of the second clock terminal;
applying a low level to the gate starting terminal and the first clock terminal and a high level to the second clock terminal, such that the output control module controls the gate output terminal to output the high level of the second clock terminal while maintaining the storage capacitor at a high level; and
applying a high level to the reset terminal such that the second transistor is turned on, and delivering the high level of the first terminal of the storage capacitor to the gate of the fifth transistor at the same time such that the fifth transistor is turned on, and the first terminal of the storage capacitor is pulled to a low level; and the fourth transistor is turned on at the same time to make the gate output terminal output a low level.

6. The driving method of claim 5, wherein the step of applying a high level to the gate starting terminal and the first clock terminal and a low level to the second clock terminal, such that the charging module charges the storage capacitor to a high level under control of the gate starting terminal and the first clock terminal, and the gate output terminal outputs the low level of the second clock terminal particularly includes:
applying a high level to the gate starting terminal and the first clock terminal, such that the first transistor and the sixth transistor are turned on, the first terminal of the storage capacitor is charged to a high level, and the third transistor is turned on;
applying a low level to the second clock terminal at the same time, such that the low level of the second clock terminal is outputted to the gate output terminal.

7. The driving method of claim 5, wherein the applying a low level to the gate starting terminal and the first clock terminal and a high level to the second clock terminal, such that the output control module controls the gate output terminal to output the high level of the second clock terminal while maintaining the storage capacitor at a high level particularly include:
applying a low level to the gate starting terminal and the first clock terminal, such that the first transistor and the sixth transistor are turned off, the first terminal of the storage capacitor is maintained at a high level, and the third transistor is turned on;
applying a high level to the second clock terminal at the same time, such that the high level of the second clock terminal is outputted to the gate output terminal through the third transistor.

8. A shift register circuit, including a plurality of cascaded shift register units of claim 1, wherein a signal at the gate output terminal of the shift register unit in the next stage is fed back to the reset terminal of the shift register unit in the precedent stage.

9. A display apparatus, including the shift register circuit of claim 8.

10. The shift register unit of claim 2, wherein the charging module includes a first transistor and a sixth transistor, wherein a gate and a source of the first transistor are connected to the gate starting terminal, and a drain thereof is connected to the first terminal of the storage capacitor to charge the storage capacitor when the gate starting terminal is at a high level; a gate of the sixth transistor is connected to the first clock terminal, a source thereof is connected to the gate starting terminal, and a drain thereof is connected to the first terminal of the storage capacitor to charge the storage capacitor when the gate starting terminal and the first clock terminal are both at a high level.

11. A shift register circuit, including a plurality of cascaded shift register units of claim 2, wherein a signal at the gate output terminal of the shift register unit in the next stage is fed back to the reset terminal of the shift register unit in the precedent stage.

12. A shift register circuit, including a plurality of cascaded shift register units of claim 3, wherein a signal at the gate output terminal of the shift register unit in the next stage is fed back to the reset terminal of the shift register unit in the precedent stage.

13. A shift register circuit, including a plurality of cascaded shift register units of claim 4, wherein a signal at the gate output terminal of the shift register unit in the next stage is fed back to the reset terminal of the shift register unit in the precedent stage.

* * * * *